(12) United States Patent
Kojori et al.

(10) Patent No.: US 7,466,573 B2
(45) Date of Patent: Dec. 16, 2008

(54) METHOD AND APPARATUS FOR INTEGRATED ACTIVE-DIODE-ORING AND SOFT POWER SWITCHING

(75) Inventors: Hassan Ali Kojori, Mississauga (CA); Yang Ye, Mississauga (CA)

(73) Assignee: Honeywell International, Inc., Morristown, NJ (US)

( * ) Notice: Subject to any disclaimer, the term of this patent is extended or adjusted under 35 U.S.C. 154(b) by 379 days.

(21) Appl. No.: 11/434,245

(22) Filed: May 16, 2006

(65) Prior Publication Data

US 2007/0268726 A1 Nov. 22, 2007

(51) Int. Cl.
*H02M 7/00* (2006.01)
*G05F 1/40* (2006.01)

(52) U.S. Cl. .................... 363/65; 323/271
(58) Field of Classification Search ............. 323/268, 323/271, 272, 282; 363/65, 71
See application file for complete search history.

(56) References Cited

U.S. PATENT DOCUMENTS

| | | | |
|---|---|---|---|
| 5,881,251 A | 3/1999 | Fung et al. | |
| 5,945,816 A | 8/1999 | Marusik | |
| 5,996,035 A | 11/1999 | Allen et al. | |
| 6,121,693 A | 9/2000 | Rock | |
| 6,130,813 A | 10/2000 | Kates et al. | |
| 6,232,676 B1 | 5/2001 | Kozyra et al. | |
| 6,301,133 B1 | 10/2001 | Cuadra et al. | |
| 6,353,523 B1 | 3/2002 | Niv et al. | |
| 6,362,608 B1 * | 3/2002 | Ashburn et al. | 323/272 |
| 6,400,203 B1 | 6/2002 | Bezzi et al. | |
| 6,447,309 B1 | 9/2002 | Ko et al. | |
| 6,459,600 B2 | 10/2002 | Farrington et al. | |
| 6,462,926 B1 | 10/2002 | Zaretsky et al. | |
| 6,522,515 B1 | 2/2003 | Whitney | |

(Continued)

FOREIGN PATENT DOCUMENTS

JP 10-51286 A 2/1998

(Continued)

OTHER PUBLICATIONS

Electronic Datasheet of BC857 and BC 858, from SGS-Thomson Microelectronics; Oct. 1997; pp. 1-5.

(Continued)

*Primary Examiner*—Matthew V Nguyen
(74) *Attorney, Agent, or Firm*—Oral Caglar, Esq.

(57) ABSTRACT

A method and an apparatus are used for power supply input connection. The apparatus according to one embodiment comprises a first switch module (143_1) connected to a first power supply input (Vin1); a first controller module (145_1) connected to the first power supply input (Vin1) and to a secondary power connection (Vc), wherein the first controller module (145_1) puts the first switch module (143_1) in a first operating state when a parameter relating to the first power supply input (Vin1) is larger than a parameter relating to the secondary power connection (Vc), and puts the first switch module (143_1) in a second operating state when the parameter relating to the first power supply input (Vin1) is smaller than the parameter relating to the secondary power connection (Vc); and a first driver module (160_1) connected to the first controller module (145_1) and to the first switch module (143_1), wherein the first driver module (160_1) modifies a parameter relating to a drive characteristic of the first switch module (143_1).

21 Claims, 13 Drawing Sheets

U.S. PATENT DOCUMENTS

| | | |
|---|---|---|
| 6,526,466 B1 | 2/2003 | Frake et al. |
| 6,538,864 B2 * | 3/2003 | Mullner ................... 361/58 |
| 6,574,695 B1 | 6/2003 | Mott et al. |
| 6,604,916 B2 | 8/2003 | Lu et al. |
| 6,636,919 B1 | 10/2003 | Huth |
| 6,654,843 B1 | 11/2003 | Wakeley et al. |
| 6,704,825 B1 | 3/2004 | Lascu et al. |
| 6,771,478 B2 | 8/2004 | Ochi |
| 6,810,458 B1 | 10/2004 | Bazargan et al. |
| 6,836,103 B2 * | 12/2004 | Brooks et al. ............. 323/282 |
| 6,850,048 B2 | 2/2005 | Orr et al. |
| 6,891,425 B1 | 5/2005 | Huynh |
| 7,071,662 B2 * | 7/2006 | Hsu et al. .................. 323/272 |
| 2002/0154464 A1 | 10/2002 | Vinciarelli et al. |
| 2004/0027186 A1 | 2/2004 | Teterud |
| 2005/0127979 A1 | 6/2005 | Fan et al. |
| 2006/0044709 A1 | 3/2006 | Seiersen |

FOREIGN PATENT DOCUMENTS

| | | |
|---|---|---|
| JP | 2005-295794 A | 10/2005 |
| WO | WO-2004/025801 A1 | 3/2004 |
| WO | WO-2005/020286 A2 | 3/2005 |

OTHER PUBLICATIONS

Electronic Datasheet of BC847, from SGS-Thomson, Microelectronics; Oct. 1997; pp. 1-4.

Electronic Datasheet of IRLML6401, from International Rectifier; Apr. 29, 2003; pp. 1-9.

Electronic Datasheet of 30BQ015, from International Rectifier; Mar. 2003; pp. 1-6.

Electronic Datasheet of LTC4412HV, from Linear Technology; pp. 1-12.

* cited by examiner

METHOD AND APPARATUS FOR INTEGRATED ACTIVE-DIODE-ORING AND SOFT POWER SWITCHING

CROSS REFERENCE TO RELATED APPLICATION

This non-provisional application is related to co-pending non-provisional application titled "Method and Apparatus for Hot Swap of Line Replaceable Modules for AC and DC Electric Power Systems" filed concurrently herewith, the entire contents of which are hereby incorporated by reference.

BACKGROUND OF THE INVENTION

1. Field of the Invention

The present invention relates to electric power systems, and more particularly to a method and apparatus for connection of multiple power supply inputs, and for soft-switching during hot swap of modules for AC and DC electric power systems.

2. Description of the Related Art

Electric systems used in complex environments such as aerospace systems, more electric aircraft systems, industrial environments, vehicles, etc., include a large number of electric modules. Various electric modules may need to be extracted and replaced with other modules, to change functionality or to replace modules that exhibit faults.

Hot swap, hot-plug, and hot-dock are terms used interchangeably to refer to the process of safely inserting or removing cards, PC boards, cables, and/or modules from a host system without removing power. The goal of hot swap is to insert or remove modules without disturbing, damaging, or degrading up/down-stream adjacent line replaceable modules/subsystems, to increase system availability, reduce down time, simplify system repair, and allow for system maintenance/upgrade without interrupting service to other loads.

Electric modules included in environments such as aerospace systems, more electric aircraft systems, industrial environments, vehicles, etc., may be connected to multiple power supply voltage inputs, and extract one voltage output to be used by the modules. During hot swap of electrical modules, the multiple power supply voltage inputs are also connected or disconnected from the host system, or from the removable electrical modules, without removing power.

If not designed for properly, hot swap can cause severe electrical, mechanical, thermal and operational problems in an electrical system. For example, pulling a board/module out while there is current passing through the module connectors, or inserting a board/module with all bulk/bypass capacitors at zero volts, can introduce severe electrical voltage/current transients which may adversely impact reliability and lead to safety consequences. Current chopping introduces Ldi/dt variations (where L is inductance of a load, for example) leading to very large voltage transients which are a major safety concern for maintenance people, as large voltage transients can cause high voltage electrical shock.

One problem with typical/conventional techniques for hot-swap is a lack of proper connection of multiple power supply voltage inputs for a voltage output for replaceable modules. Typical/conventional methods use passive diode-ORing systems to connect multiple power supply voltage inputs to a supply bus for replaceable modules. Such passive diode-ORing systems result in excessive power losses and voltage drops. Significant voltage drops, particularly when preferred paths of power consumption from AC and DC sources are required, are a major problem. Current chopping occurring during insertion or extraction of modules is a major contributor to excessive voltage/current transients that stress and damage individual components and reduce the Mean Time Between Failure (MTBF) for the host system and for the removable modules.

A number of publications have studied ORing systems for electrical modules. One such system is described in U.S. Pat. No. 6,891,425 B1 titled "Low Voltage OR'ing Circuits and Methods with Zero Recovery Time" by Thong Huynh. The system described in this patent includes a MOSFET coupled between a power supply and a load, a controller that senses the current through the MOSFET and turns the MOSFET off when the current falls below a predetermined threshold current, and a second MOSFET adding hot swap capability. This circuit, however, does not protect against transient voltages/currents when a board is taken-out from a motherboard/backplane. Moreover, the second MOSFET is designed to work both in the switch mode and in the linear mode. Because the second MOSFET has to operate both in the switch mode and in the linear mode, the linear range is narrow, which, together with typical variations in threshold voltage Vth, make the control of the second MOSFET in the linear mode hard to reproduce.

A disclosed embodiment of the application addresses these and other issues by utilizing a method and apparatus for integrated active-diode-ORing and soft power switching. The method and apparatus achieve proper connection of multiple power supply voltage inputs to realize a fault tolerant power supply bus for replaceable modules. The method and apparatus provide soft power-up/down capability during hot swap of modules for AC and DC electric power systems. The method and apparatus provide a single power bus from multiple power supply inputs, with minimum voltage drop, improved efficiency, and no looses in passive diodes. The method and apparatus provide integrated soft-switching that reduces turn-on in-rush current during board/module insertion and further eliminates current-chopping during interruption of current in inductive circuits. The method and apparatus can be used for both low and high power systems.

SUMMARY OF THE INVENTION

The present invention is directed to a method and an apparatus for power supply input connection. According to a first aspect of the present invention, an apparatus for power supply input connection comprises: a first switch module connected to a first power supply input; a first controller module connected to the first power supply input and to a secondary power connection, wherein said first controller module puts the first switch module in a first operating state when a parameter relating to the first power supply input is larger than a parameter relating to the secondary power connection, and puts the first switch module in a second operating state when the parameter relating to the first power supply input is smaller than the parameter relating to the secondary power connection; and a first driver module connected to the first controller module and to the first switch module, wherein the first driver module modifies a parameter relating to a drive characteristic of the first switch module.

According to a second aspect of the present invention, an apparatus for power supply input connection comprises: a first switch module connected to a first power supply input, the first switch module including a first field effect transistor; a first controller module connected to the first power supply input and to a secondary power connection, wherein the first controller module puts the first switch module in a first operating state when a parameter relating to the first power supply input is larger than a parameter relating to the secondary power system, and puts the first switch module in a second operating state when the parameter relating to the first power supply input is smaller than the parameter relating to the secondary power system; a first driver module connected to the first controller module and to the first switch module, wherein the first driver module modifies a parameter relating to a drive characteristic of the first switch module; and a first resistor connected to a body diode of the first field effect transistor, wherein the first resistor and the body diode of the first field effect transistor are connected in series between the first power supply input and the secondary power connection.

According to a third aspect of the present invention, a method for connection of power supply inputs comprises: providing a first power supply voltage input, a second power supply voltage input, and an output; isolating the first power supply voltage input from the output with a first switch module, the first switch module including a first gate; isolating the second power supply voltage input from the output with a second switch module, the second switch module including a second gate; and controlling the first switch module and the second switch module, the controlling step including turning the first switch module on when a voltage of the first power supply voltage input is larger than a voltage of the second power supply voltage input, turning the first switch module off when the voltage of the first power supply voltage input is smaller than the voltage of the second power supply voltage input, turning the second switch module on when a voltage of the second power supply voltage input is larger than a voltage of the first power supply voltage input, turning the second switch module off when the voltage of the second power supply voltage input is smaller than the voltage of the first power supply voltage input, modifying a parameter relating to a gate drive characteristic of the first switch module, and modifying a parameter relating to a gate drive characteristic of the second switch module.

BRIEF DESCRIPTION OF THE DRAWINGS

Further aspects and advantages of the present invention will become apparent upon reading the following detailed description in conjunction with the accompanying drawings, in which.

DETAILED DESCRIPTION

Figure 1:
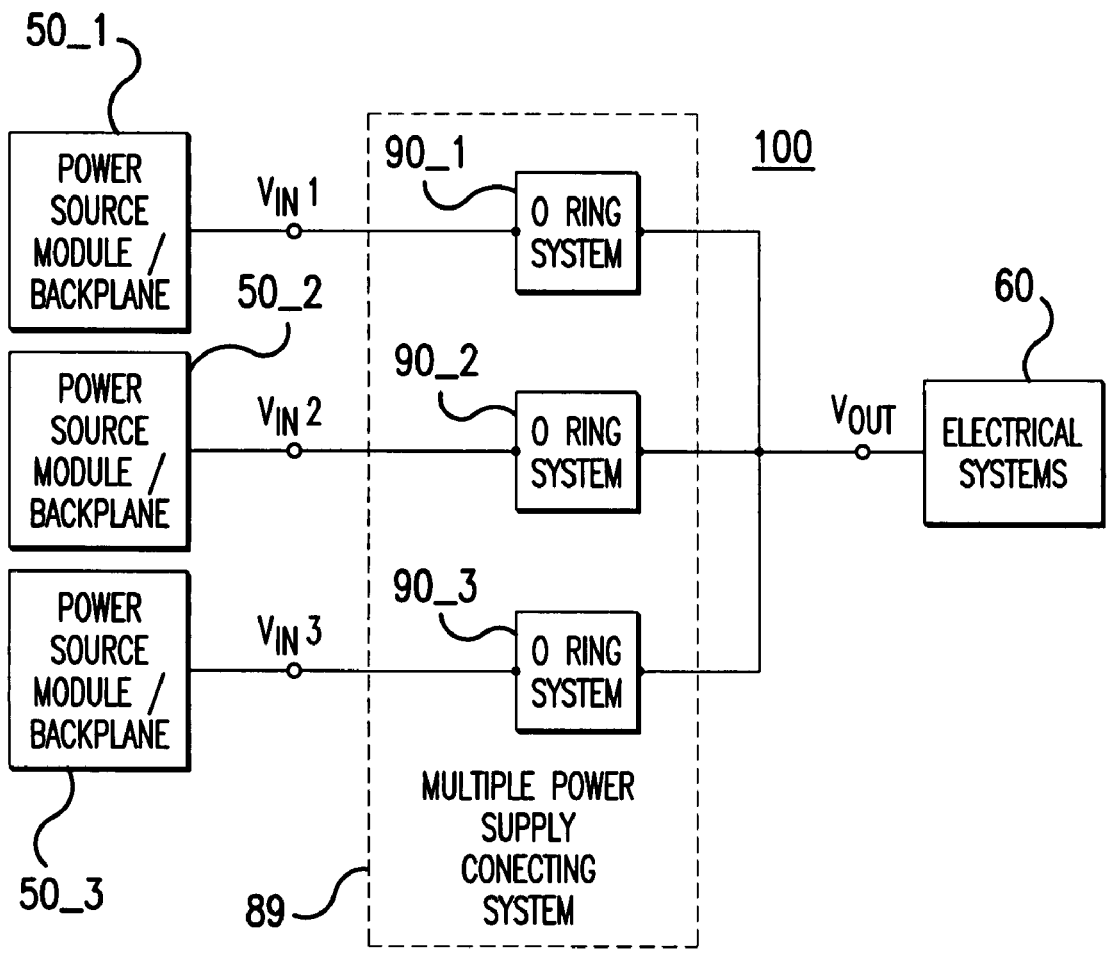
FIG. 1 is a general block diagram of an electrical system including a system for active-diode-ORing and soft power switching according to an embodiment of the present invention.

Aspects of the invention are more specifically set forth in the accompanying description with reference to the appended figures. FIG. 1 is a general block diagram of an electrical system including a system for active-diode-ORing and soft power switching according to an embodiment of the present invention. The electrical system 100 illustrated in FIG. 1 includes the following components: power source modules/backplane 50_1, 50_2, 50_3; a multiple power supply connecting system 89; and electrical systems 60. Operation of the electrical system 100 in FIG. 1 will become apparent from the following discussion.

Electrical system 100 may be associated with an aircraft, a more electric aircraft, a ship, a laboratory facility, an industrial environment, etc. The power source modules/backplane 50_1, 50_2, 50_3 provide electrical energy in electrical system 100. The power source modules/backplane 50_1, 50_2, 50_3 may include AC and DC power supplies, electrical components such as transformers, inductances, resistances, etc. The power source modules/backplane 50_1, 50_2, 50_3 may provide high DC or AC voltages or low DC or AC voltages to electrical systems 60 through multiple power supply connecting system 89. Power inputs Vin1, Vin2, and Vin3 from power source modules/backplane 50_1, 50_2, 50_3 are combined and integrated in multiple power supply connecting system 89, which outputs one voltage output Vout to electrical systems 60. Multiple power supply connecting system 89 includes three ORing systems 90_1, 90_2 and 90_3. ORing systems 90_1, 90_2 and 90_3 are integrated active-diode-OR circuits and realize a fault tolerant power supply bus for the electrical systems 60.

Electrical systems 60 may include various electrical systems, such as systems on an aircraft or ship, navigation systems, cabin systems, air conditioning systems, etc., systems in an industrial facility such as electrical equipment and tools, etc. Electrical systems 60 may include DC and AC loads, which are electric circuits using DC and AC power that enable functioning of various services onboard a vehicle or aircraft, in a complex environment such as a laboratory facility, etc. Services using AC and DC power may be an electric motor, an automatic braking system, a lighting system of a vehicle, a piece of industrial equipment, etc.

Electrical systems 60 may be replaceable modules that can be disconnected from electrical system 100, or inserted into electrical system 100. ORing systems 90_1, 90_2 and 90_3 provide soft power-up/down capability for electrical systems 60 during hot swap of electrical systems 60.

ORing systems 90_1, 90_2 and 90_3 and electrical systems 60 may together be included in a replaceable module, so that ORing systems 90_1, 90_2 and 90_3 together with electrical systems 60 can be removed from or inserted into electrical system 100. In this case, ORing systems 90_1, 90_2 and 90_3 provide soft power-up/down capability for a replaceable module that includes electrical systems 60 and ORing systems 90_1, 90_2 and 90_3, during hot swap of the replaceable module from or into electrical system 100.

Electrical systems 60 may be circuits/devices included in replaceable module such as an AC or DC Line Replaceable Module (LRM), a card, a PC board, etc. Electrical systems 60 may be part of a high voltage AC or DC LRM. Electrical systems 60 may be included in a replaceable module with on-board Solid State Switching Devices (SSSDs). Electrical systems 60 may be included in a high voltage Solid State AC or DC replaceable module switch, referred to in the industry as a Solid State Remote Power Controller (SSPC). Electrical systems 60 may be included in various types of LRMs such as: Power Supplies (PS-LRM), Digital Controllers (DC-LRM), AC Solid-State-Remote-Controller (AC-SSPC-LRM), DC Solid-State-Remote-Controller (DC-SSPC-LRM), LRMs used for aircraft platforms and More Electric platforms, PC boards or cards, etc. Solid State AC and DC switches can be used with a wide range of powers, from a few Watts to hundreds of KWatts. LRMs including AC and DC Solid State Switching Devices (SSSDs) may manage high voltage AC and DC powers and loads, and may control the flow of electrical power to internal and external circuitry/loads, to achieve proper protection based on $i^2 \cdot t$ (instantaneous overcorrect protection for large currents and proportionally time-delayed overload protection for smaller currents) to protect the SSSDs or the wiring system.

Power source modules/backplane 50_1, 50_2, 50_3 may provide various voltages to electrical systems 60 included in an LRM. Such voltages may be various AC voltages such as, for example, 115V or 230V or higher, with fixed frequencies (such as, for example, 50/60 Hz or 400 Hz), or variable frequencies (such as, for example 360-800 Hz for aerospace applications), or DC voltages such as, for example, 28V or 270V. The power of AC and DC LRMs may depend on the number of channels, as well as current rating and voltage of each channel. For example, an AC LRM for the Airbus A380 aircraft has 8 channels. Such AC and DC LRM boards are currently being deployed in aerospace and industry, and are poised to eventually replace traditional electromechanical AC/DC circuit breakers or relays, to reduce the overall system cost and weight, and improve reliability. Emerging Solid State AC and DC switches are poised to have widespread use in both commercial and military aerospace applications and general industry, for a few Watts to hundreds of KW power applications. Currently, due to excessive cost, weight and board space penalties, AC and DC SSPC LRM cards do not include integrated active diode ORing circuits for soft power-up/down capability, and circuit breakers or relays which could be turned-off before initiating a hot swap of a failed LRM with one or more SSPC devices failed short. Hence, conventional hot swap is not properly designed for such LRM/boards.

ORing systems 90_1, 90_2 and 90_3 provide soft power-up/down capability for electrical systems 60 during hot swap of electrical systems 60, and protect components of electrical system 100 during hot swap insertion or removal of electrical systems 60 under normal or faulty modes of operation for high voltage DC and AC systems without the need to disconnect power. ORing systems 90_1, 90_2 and 90_3 are circuits with a combined function of active OR (low forward voltage drop and low reverse leakage) and soft-start/stop; provide integrated soft-switching to reduce turn-on in-rush current during board insertion; eliminate current-chopping during interruption of current in inductive circuits; contribute to safe and reliable insertion and removal of different types of LRMs during hot swap, without disturbing, damaging, or degrading up/down-stream adjacent LRMs and subsystems of electrical system 100; help high voltage AC and DC load management LRMs to control the flow of electrical power to internal and external circuitry/loads and achieve proper protection of SSSDs or the wiring system; provide a single power bus from multiple power supply input with minimized voltage drop and improved efficiency; help to safely insert a board/module when the board is not electrically initialized, and to safely pull a board-out while there is current passing through connectors; help provide hot swap protection beyond local boundaries of the replaceable modules; help mitigate hot swap effects, so that various bus activities and other operations taking place in electrical system 100 are not disturbed during hot swap of one or more replaceable modules; help in establishing autonomy of subsystems in electrical system 100 and automatic system reconfiguration based on the type of replaceable modules extracted or inserted; etc.

Although three power supply voltage inputs are shown in FIG. 1, more than three or less than three power supply voltage inputs can be connected through multiple power supply connecting system 89, with each power supply voltage inputs connecting to its own ORing system inside multiple power supply connecting system 89.

Although the systems in electrical system 100 are shown as discrete units, it should be recognized that this illustration is for ease of explanation and that the associated functions of certain functional modules or systems can be performed by one or more physical elements.

Figure 2:
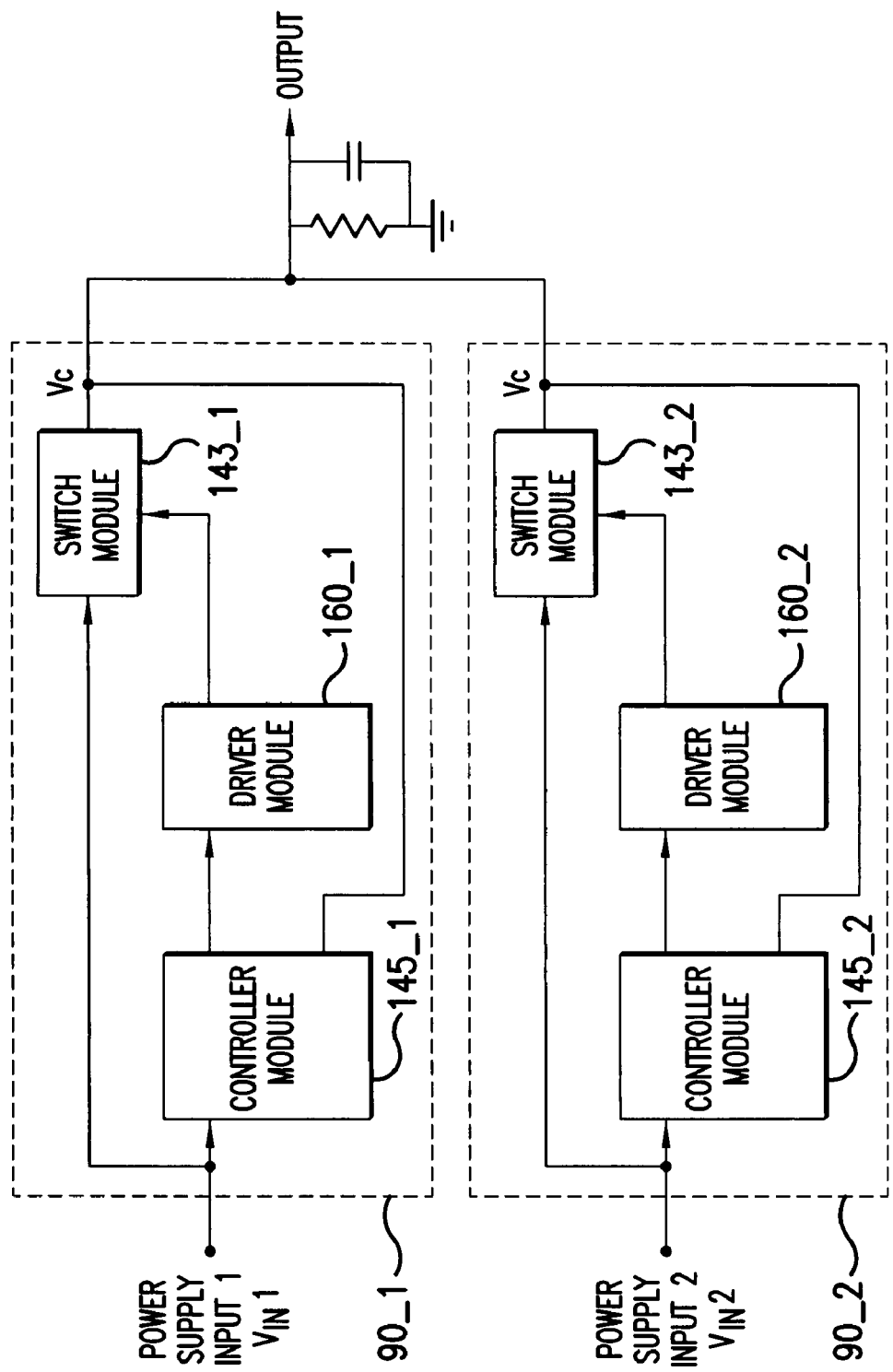
FIG. 2 is a block diagram of an electrical configuration containing a system for active-diode-ORing and soft power switching according to an embodiment of the present invention illustrated in FIG. 1.

FIG. 2 is a block diagram of an electrical configuration containing a system for active-diode-ORing and soft power switching according to an embodiment of the present invention illustrated in FIG. 1. The electrical system illustrated in FIG. 2 includes two ORing systems 90_1 and 90_2. ORing system 90_1 includes a controller module 145_1, a switch module 143_1, and a driver module 160_1. ORing system 90_2 includes a controller module 145_2, a switch module 143_2, and a driver module 160_2.

Controller module 145_1 is connected to a first power supply input Vin1, and controller module 145_2 is connected to a second power supply input Vin2. Controller module 145_1 controls the switch module 143_1 through the driver module 160_1, which modifies the drive capability of switch module 143_1. For example, driver module 160_1 may provide current gain to reduce the driver impedance and speed the charging and discharging of a capacitance, when switch module 143_1 includes a capacitor such as the capacitor of a MOSFET gate.

Controller module 145_1 turns on the switch module 143_1 when Vin1>Vc, and turns off the switch module 143_1 when Vin1<Vc, or vice versa. Similarly, controller module 145_2 turns on the switch module 143_2 when Vin2>Vc, and turns off the switch module 143_2 when Vin2<Vc, or vice versa. The output resistor and capacitor pick up electrical parameters, such as current or voltage, from switch modules 143_1 and 143_2. Depending on the magnitudes of Vin1 and Vin2, switch module 143_1 or 143_2 may be on or off, transmitting electrical parameters such as current or voltage to the output resistor and capacitor.

Figure 3A:
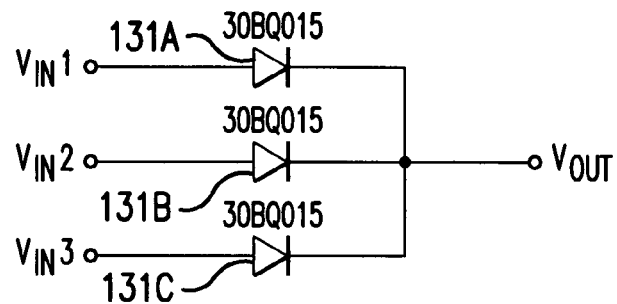
FIG. 3A is a typical/conventional block diagram showing an electrical configuration containing a diode ORing system consisting of schottky diodes.

FIG. 3A is a typical/conventional block diagram showing an electrical configuration containing a diode ORing system consisting of schottky diodes. As shown in FIG. 3A, three schottky diodes 131A, 131B, and 131C are used to obtain a voltage output Vout for an LRM, from three voltage inputs Vin1, Vin2, and Vin3. The three channels with inputs Vin1, Vin2, and Vin3 are OR-ed with three 30BQ015 schottky diode rectifiers, to generate the power source Vout for an individual LRM. The 30BQ015 schottky diode rectifier is described in the Datasheet of 30BQ015 Schottky Rectifier from International Rectifier, which is herein incorporated by reference.

The circuit in FIG. 3A, however, presents a high forward voltage drop of Vf=0.25V at 1A and at Tj=25° C. (for 30BQ015), and a high reverse leakage current Ir=20 mA at Tj=100° C. (for 30BQ015). The circuit in FIG. 3A does not offer advantages such as inrush current control and negative clamping, for hot swap of LRMs.

A circuit such as the circuit shown in FIG. 3A is used in Gen2.0 of A380 SEPDS (Secondary Electrical Power Distribution System) design, AC and DC LRM, GW, and GFI cards, which are getting power from three different channels out of two Power Supply Modules (PSMs).

Figure 3B:
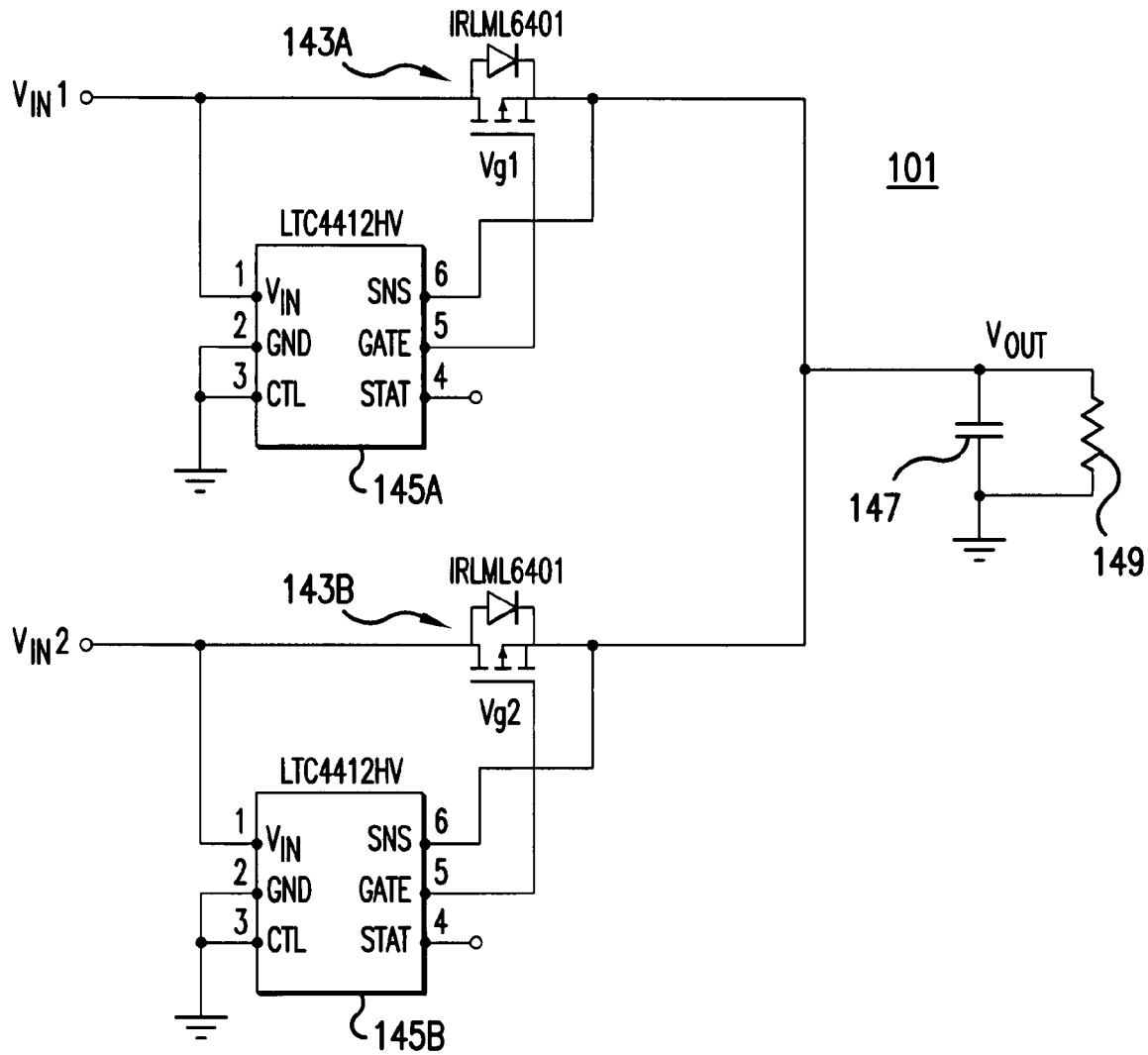
FIG. 3B is a typical/conventional block diagram showing an electrical configuration containing an active ORing circuit with one FET without driver.

FIG. 3B is a typical/conventional block diagram showing an electrical configuration containing an active ORing circuit with one FET without driver. The electrical configuration 101 in FIG. 3B is a circuit for an active ORing configuration with one FET without a driver, with two channels of input Vin1 and Vin2.

The ORing circuit in FIG. 3B uses an LTC4412HV controller in ThinSOT from Linear Technology (elements 145A and 145B) for each input channel. The LTC4412HV controller is described in the Datasheet of LTC4412HV, 36V, Low Loss PowerPath™ Controller in ThinSOT from Linear Technology, which is herein incorporated by reference. Each channel input also includes a P-channel HEXFET® Power MOSFET (elements 143A and 143B), which is described in the Datasheet of IRLML6401 from International Rectifier, which is herein incorporated by reference.

LTC4412HV provides the benefits of a wide operating temperature range of −40° C. to 125° C. and a small package of SOT23-6 (ThinSOT). Because LTC4412HV is a P-channel MOSFET controller, no charge pump is required, which is good when dealing with electromagnetic interference (EMI) effects. One drawback of the LTC4412HV controller is that the driving capability is low. Typically, the GATE pin can sink 50 uA and source only 2.5 uA.

Figure 3C:
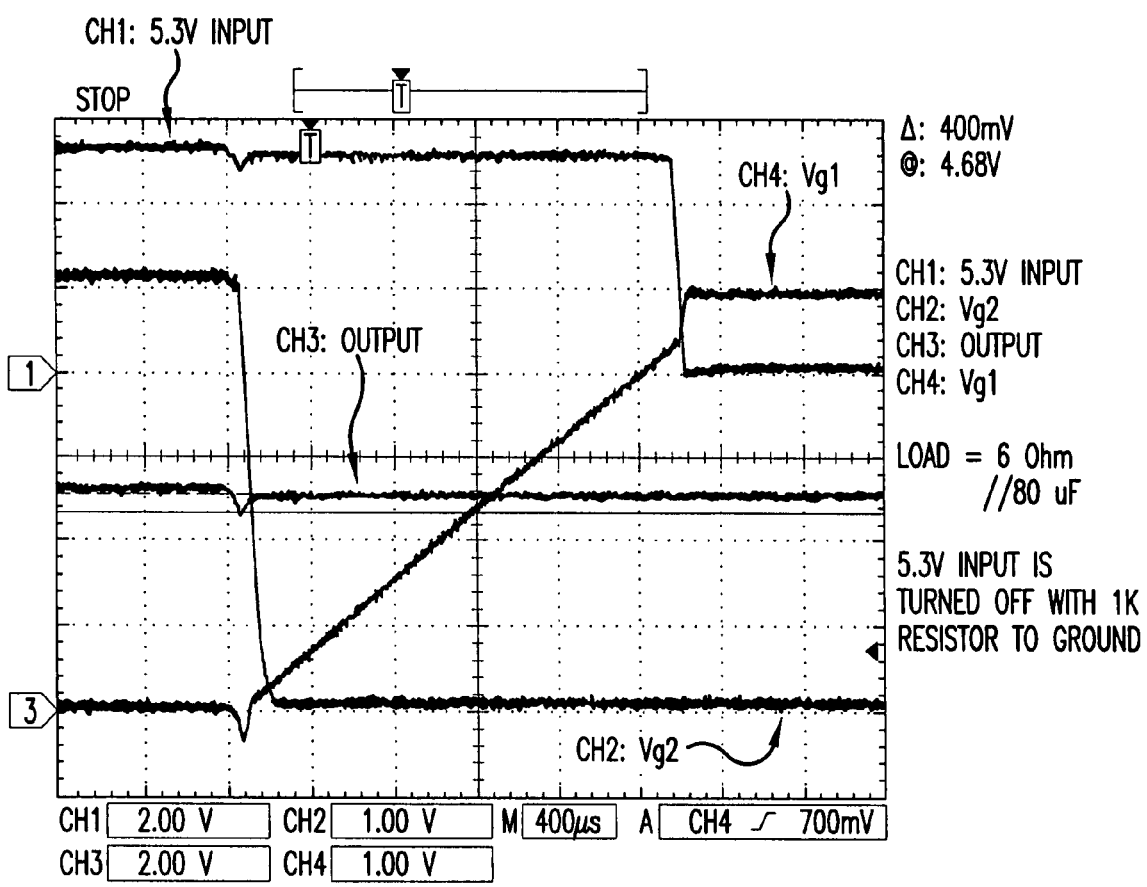
FIG. 3C is a graph for load transfer between input sources for the electrical configuration containing an active ORing circuit with one FET without driver illustrated in FIG. 3B.

FIG. 3C is a graph for load transfer between input sources for the electrical configuration containing an active ORing circuit with one FET without a driver illustrated in FIG. 3B.

The graph in FIG. 3C was obtain for exemplary values for load resistance 149 and capacitance 147, chosen according to configurations associated with AC and DC LRM configurations receiving the output Vout. In particular, the load resistance 149 had a value of 6Ω, and the capacitance 147 had a value of 80 uF. The input voltage Vin1 was 5.3V nominal, and the input voltage Vin2 was 5.1V nominal. FIG. 3C illustrates the load transfer from 5.3V to 5.1V with one FET without a driver.

The waveforms in FIG. 3C show the transfer between the two input sources Vin1 and Vin2. Initially, Vin1 is 5.3V, and Vin2 is 5.1V. When both Vin1 and Vin2 are on at 5.3V and 5.1V respectively, since Vin1 is higher than Vin2, Vg1 is low (switch 143A is ON) and Vg2 is high (switch 143B is OFF). Ch1 in FIG. 3C is the waveform of Vin1. Ch4 is the waveform of Vg1, and Ch2 is the waveform of Vg2. The output voltage Vout is shown in Ch3.

Vin1, which was initially 5.3V, is next turned off by, for example, a 1K resistor to ground. Vin2 remains connected to a 5.1V supply. When Vin1 is turned off, which happens at about after 2 divisions in the time scale in FIG. 3C, Vg2 (Ch2) quickly changes to low by dropping to zero, which turns switch 143B ON. Vg1 (Ch4) also changes to high (switch 143A is OFF).

However, due to the asymmetric driver capability of the controller in FIG. 3B, it takes a longer time for Vg1 (Ch4) to rise and turn switch 143A OFF. As a result, both switches 143A and 143B are ON for some time. In FIG. 3C, it can be found the overlapped ON time for switches 143A and 143B is about 5 divisions, which corresponds to about 2 ms. Hence, Vin1 (Ch1) is backfed by Vin2. Such backfeed is not acceptable in some applications.

Figure 4A:
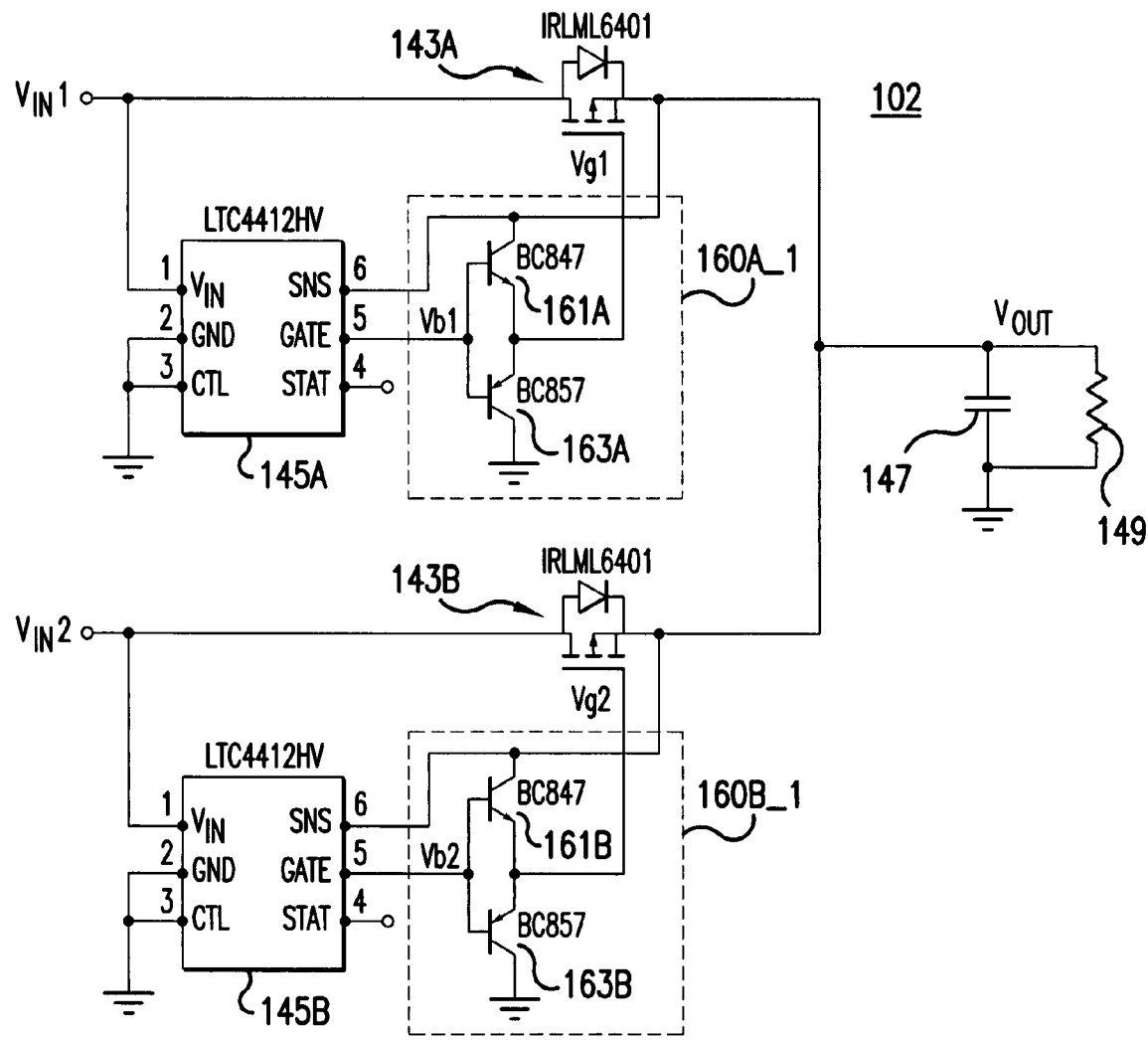
FIG. 4A is a block diagram of an electrical configuration containing an active ORing circuit with one FET with a driver according to an embodiment of the present invention.

FIG. 4A is a block diagram of an electrical configuration containing an active ORing circuit with one FET with a driver according to an embodiment of the present invention. The electrical configuration 102 in FIG. 4A has improved gate drive. FIG. 4A is a design improvement to the circuit in FIG. 3B. The driver 160A_1 shown in the block in dashed lines connects to FET 143A. The driver 160B_1 shown in the second block in dashed lines connects to FET 143A. The drivers 160A_1 and 160B_1 in the dashed boxes show the design improvement over the typical/conventional design of FIG. 3B.

The active ORing circuit with one FET with driver in FIG. 4A has two input channels. Each input channel has a controller (elements 145A and 145B), a P-channel MOSFET (elements 143A and 143B), and drivers 160A_1 and 160B_1.

The drivers 160A_1 and 160B_1 are totem-pole drivers composed of a pair of NPN and PNP transistors (totem-pole with 161A and 163A for one channel, and totem-pole with 161B and 163B for the second channel). The P-channel MOSFETS (elements 143A and 143B) are switch modules as illustrated in FIG. 2.

The controllers (elements 145A and 145B) may be LTC4412HV controllers in ThinSOT from Linear Technology. Other controllers may also be used. Any ORing controller can be used for elements 145A and 145B. The P-channel MOSFET (elements 143A and 143B) may be an IRLML6401 P-channel HEXFET® Power MOSFET. Other P-channel MOSFETs may also be used; in fact any P-channel MOSFETs can be used.

The totem-pole driver composed of the pair of NPN (161A) and PNP (163A) transistors inserted between the controller 145A and the MOSFET 143A improves the gate drive capability. Similarly, the totem-pole driver composed of the pair of NPN (161B) and PNP (163B) transistors inserted between the controller 145B and the MOSFET 143B improves the gate drive capability.

The BC847 may be chosen for the NPN transistors 161A and 161B, with the BC847 described in the Datasheet of BC847 Small Signal NPN Transistors from ST Microelectronics, which is herein incorporated by reference. Other NPN transistors may also be used. The BC857 may be chosen for the PNP transistors 163A and 163B, with the BC857 described in the Datasheet of BC857 Small Signal PNP Transistors from ST Microelectronics, which is herein incorporated by reference. Other PNP transistors may also be used.

Figure 4B:
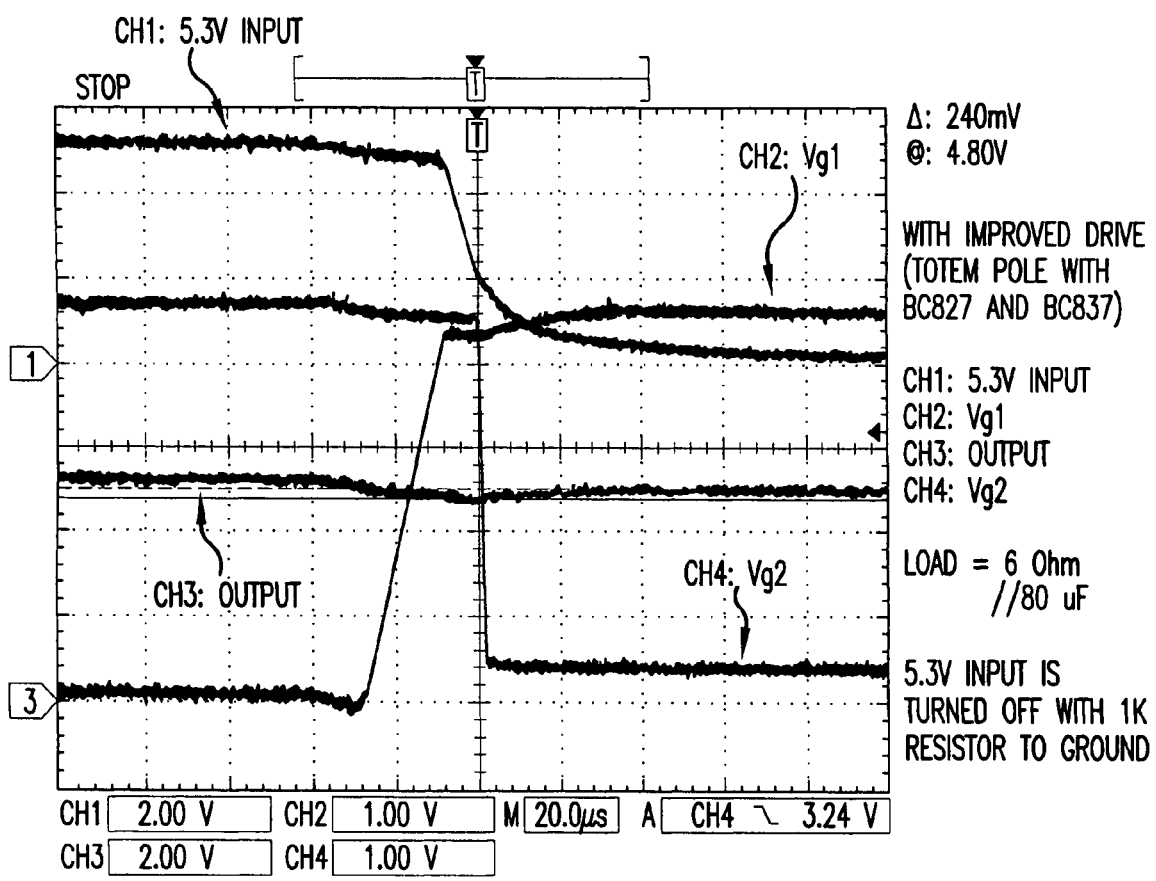
FIG. 4B is a graph for load transfer between input sources for the electrical configuration containing an active ORing circuit with one FET with a driver according to an embodiment of the present invention illustrated in FIG. 4A.

FIG. 4B is a graph for load transfer between input sources for the electrical configuration 102 containing the improved design of the active ORing circuit with one FET with a driver according to an embodiment of the present invention illustrated in FIG. 4A.

The graph in FIG. 4B was obtain for exemplary values for load resistance 149 and capacitance 147, chosen according to configurations associated with AC and DC LRM configurations receiving the output Vout. In particular, the load resistance 149 had a value of 6Ω, and the capacitance 147 had a value of 80 uF. The input voltage Vin1 was 5.3V nominal, and the input voltage Vin2 was 5.1V nominal. The waveforms in FIG. 4B are obtained from same test performed for FIG. 3C, namely FIG. 4B illustrates the load transfer from 5.3V to 5.1V.

Initially, Vin1 is 5.3V, and Vin2 is 5.1V. Vin1 is next turned off, while Vin2 remains connected to the 5.1V supply. Vg1 (Ch2), Vg2 (Ch4), and Vout (Ch3) are recorded. Significant improvement in gate rise time is achieved with the external driver circuits 160A_1 and 160B_1. The rise time of the gate signal Vg2 (Ch4) in FIG. 4B is reduced to about 20 us, which is much smaller than the value of 2 ms for Vg2 in FIG. 3C. The turn off of Vg2 in FIG. 4B also happens at some time earlier than the turn on of Vg1 in FIG. 4B. Hence, backfeeding is completely avoided with the circuit in FIG. 4A.

The circuit in FIG. 4A has improved gate drive compared to the circuit in FIG. 3B. One drawback of the circuit in FIG. 4A is that when the switch (143A or 143B) is turned off, the gate-to-source voltage is not completely 0. For the switch that is connected to Vin1 for example, $$Vgs=Vg1-Vout=(Vb1-Vbe)-Vout=(Vout-Vbe)-Vout=-Vbe.$$

From the datasheet of IRLML6401, for example, the minimum gate-to-source voltage threshold can be −0.4V. From a P-Spice simulation at −40° C., the totem-pole drive output can be Vbe=0.37V. This will make the switch 143A enter the linear region, which is not desirable.

Figure 5A:
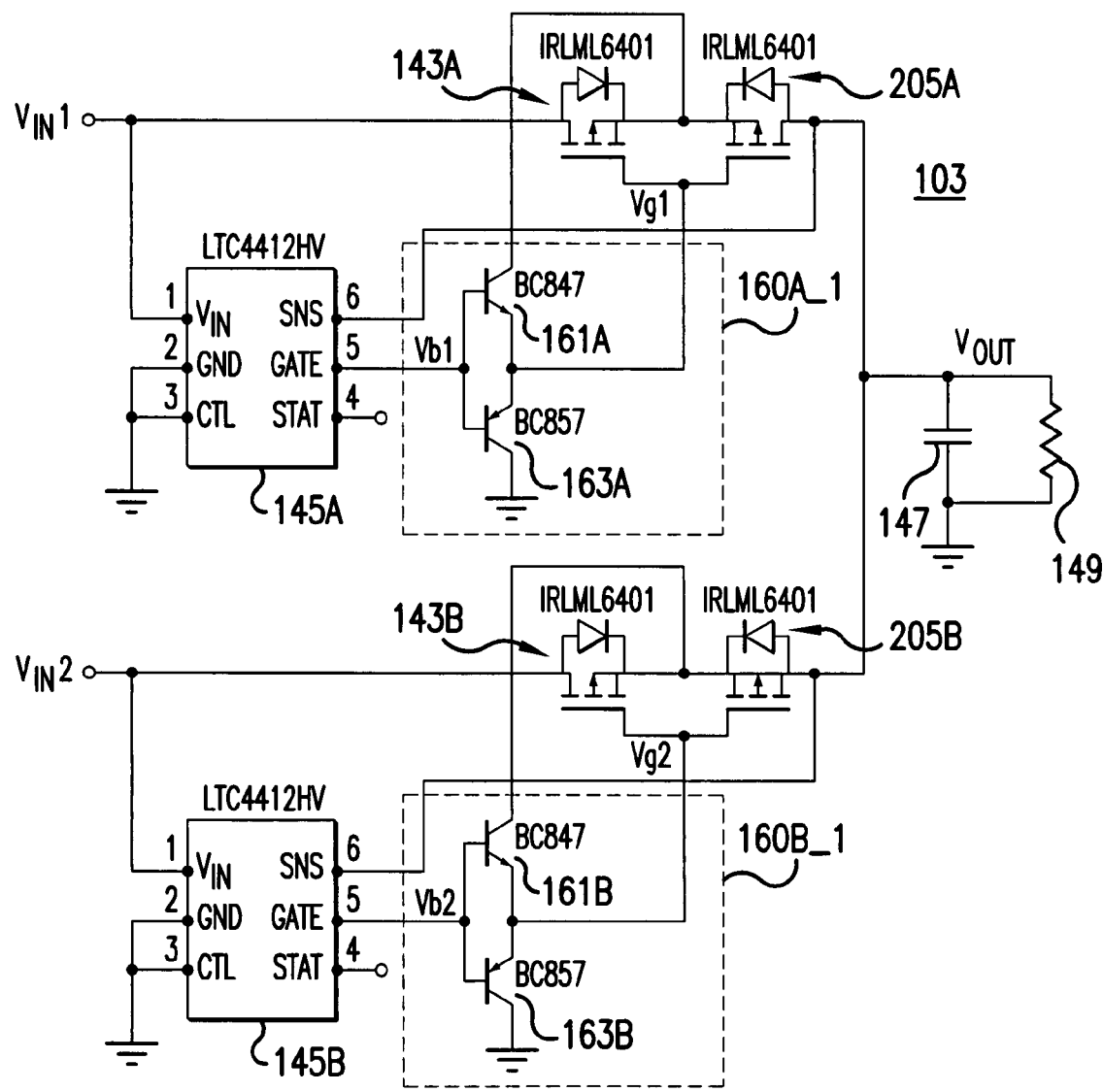
FIG. 5A is a block diagram of an electrical configuration containing an active ORing circuit with two FETs with a driver according to a second embodiment of the present invention.

FIG. 5A is a block diagram of an electrical configuration containing an active ORing circuit with two FETs with driver according to a second embodiment of the present invention. The electrical configuration in FIG. 5A is a complete active ORing circuit with two channels. The driver 160A_1 shown in the block in dashed lines connects to FETs 143A and 205A. The driver 160B_1 shown in the second block in dashed lines connects to FETs 143B and 205B.

The active ORing circuit in FIG. 5A has two input channels, but more input channels can be connected together. Each input channel has a controller (elements 145A and 145B), a switch (P-channel MOSFETs 143A and 205A, and P-channel MOSFETs 143B and 205B respectively), and a driver (160A_1 and 160B_1).

Drivers 160A_1 and 160B_1 are totem-pole drivers composed of a pair of NPN and PNP transistors (totem-pole with 161A and 163A for one channel, and totem-pole with 161B and 163B for the second channel).

The controller (elements 145A and 145B) may be a LTC4412HV controller in ThinSOT from Linear Technology. Other controllers may also be used. Any ORing controller can be used for elements 145A and 145B. The P-channel MOSFETs (elements 143A, 143B, 205A, and 205B) may be IRLML6401 P-channel HEXFET® Power MOSFETs. Other P-channel MOSFETs may also be used; in fact any P-channel MOSFETs can be used. The NPN transistors (elements 161A and 161B) may be BC847 transistors. Other NPN transistors may also be used. The PNP transistors (elements 163A and 163B) maybe BC857 transistors. Other PNP transistors may also be used.

The second FET 205A prevents the switch of the first channel from entering linear region. The second FET 205B prevents the switch of the second channel from entering linear region. The second FET 205A (and similarly 205B) is placed back-to-back in series with the original FET 143A (similarly for 143B). The body diode voltage drop cancels out the effect of Vbe in the drive circuit. For the switch that is connected to Vin1, for example:

$$Vgs=Vg1-Vs1=(Vb1-Vbe)-(Vout-Vd)=(Vout-Vbe)-(Vout-Vd)=Vd-Vbe=0.$$

Figure 5B:
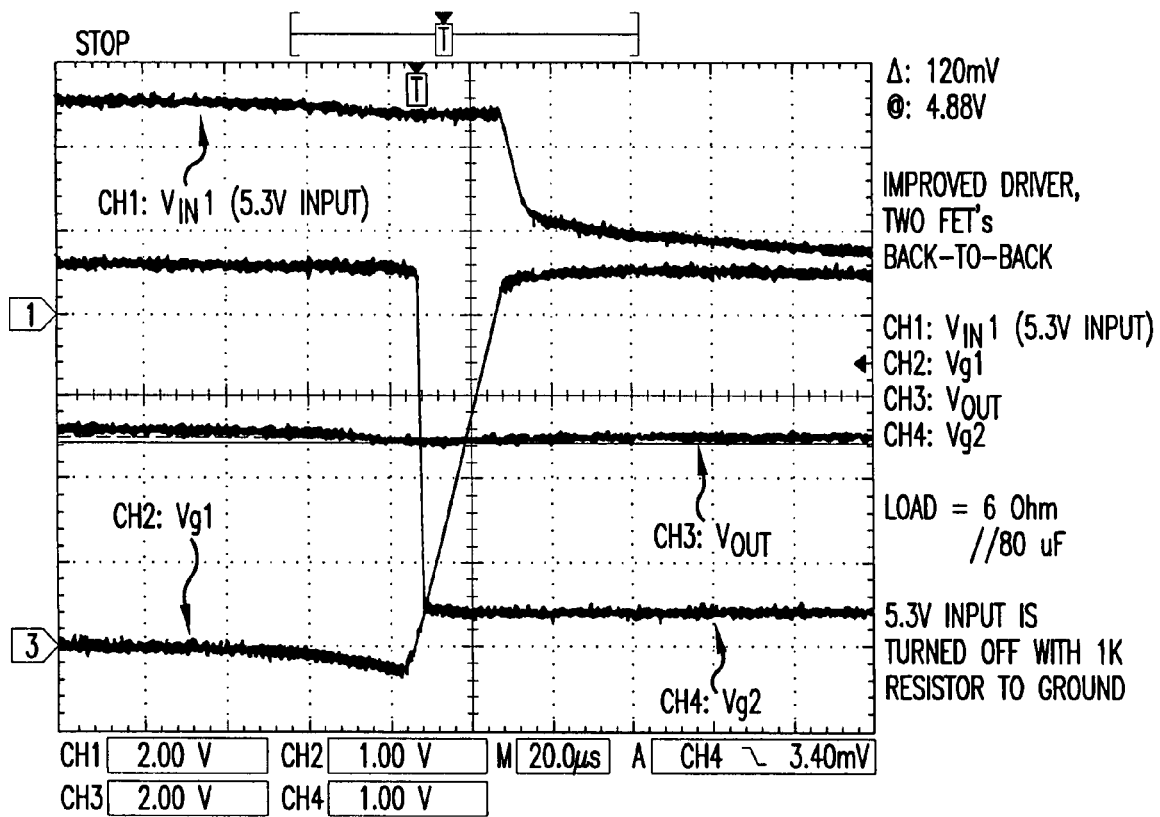
FIGS. 5B and 5C are graphs for signals and load transfers between input sources for the electrical configuration containing an active ORing circuit with two FETs with a driver according to a second embodiment of the present invention illustrated in FIG. 5A.
Figure 5C:
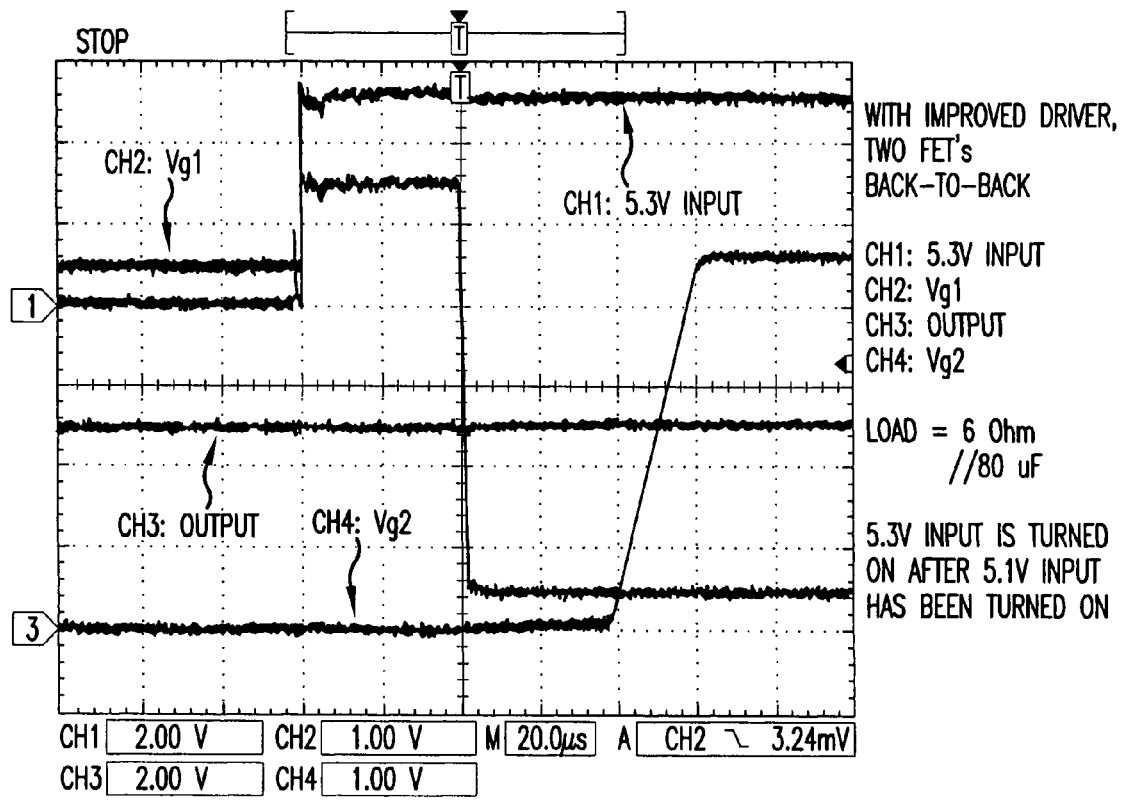

FIGS. 5B and 5C are graphs for signals and load transfers between input sources for the electrical configuration 103 containing an active ORing circuit with two FETs with driver according to an embodiment of the present invention illustrated in FIG. 5A.

The graphs in FIGS. 5B and 5C were obtain for exemplary values for load resistance 149 and capacitance 147, chosen according to configurations associated with AC and DC LRM configurations receiving the output Vout. In particular, the load resistance 149 had a value of 6Ω, and the capacitance 147 had a value of 80 uF. The input voltage Vin1 was 5.3V nominal, and the input voltage Vin2 was 5.1V nominal. FIG. 5B illustrates the load transfer from 5.3V to 5.1V for the active ORing circuit in FIG. 5A. In FIG. 5B, Ch1 is Vin1, Ch2 is Vg1, Ch3 is Vout, and Ch4 is Vg2.

FIG. 5C illustrates the load transfer from 5.1V to 5.3V for the active ORing circuit in FIG. 5A. In FIG. 5C, Ch1 is Vin1, Ch2 is Vg1, Ch3 is the output, and Ch4 is Vg2.

Figure 6A:
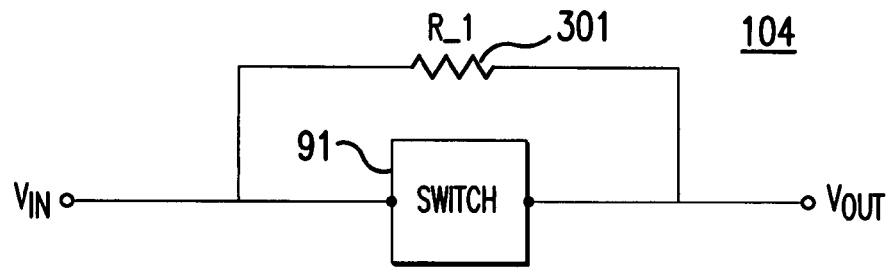
FIG. 6A is a typical/conventional general block diagram illustrating a circuit for soft-start of a source and load.

FIG. 6A is a typical/conventional general block diagram illustrating a circuit for soft-start of a load. The electrical system 104 in FIG. 6A includes a resistor R_1 in parallel with a switch 91. By connecting resistor R_1 between source and load, soft-start is achieved. The switch block 91 will be turned on to short the resistor R_1 after an output capacitor connected at the output is charged.

Figure 6B:
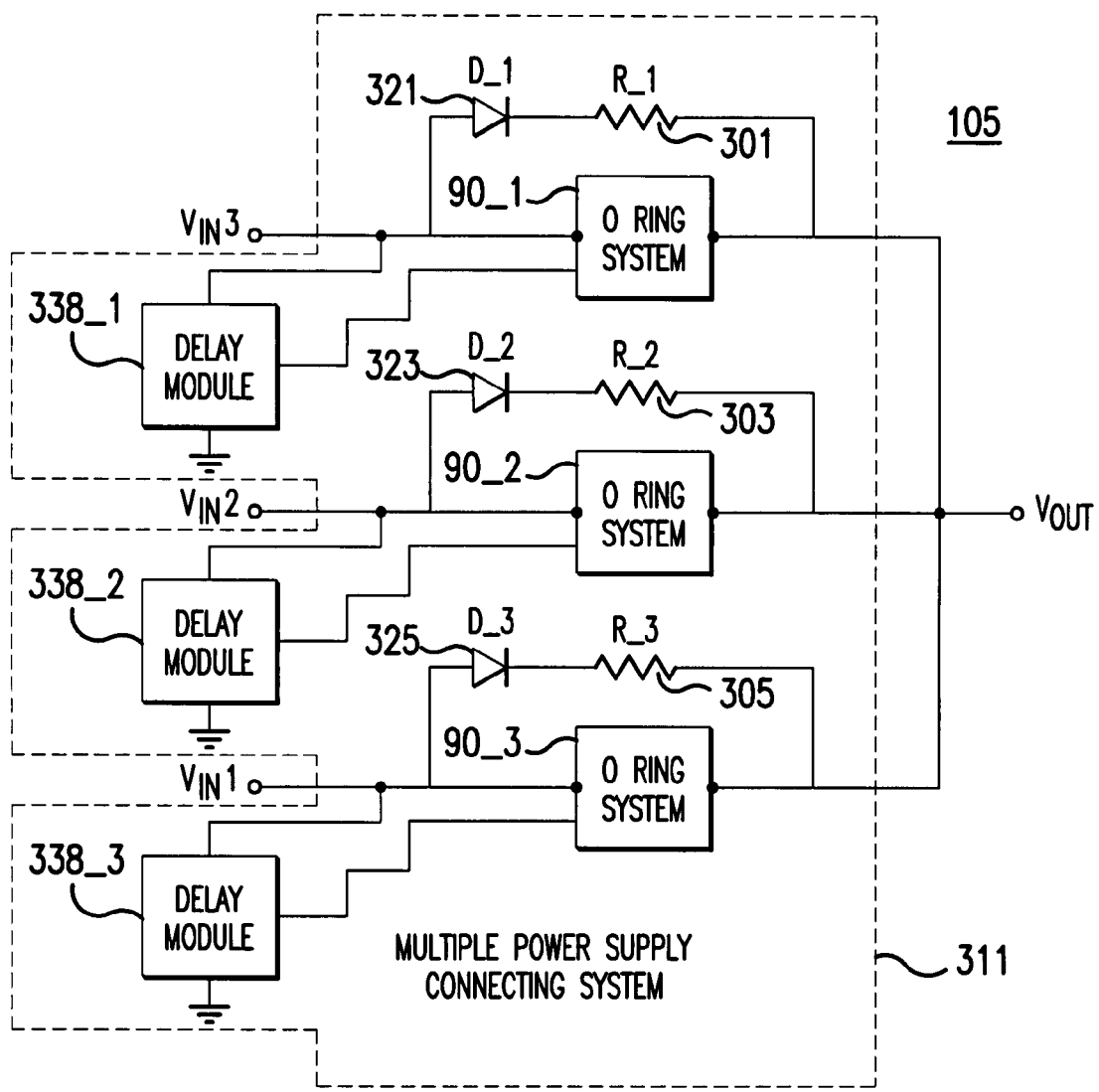
FIG. 6B is a block diagram of an electrical system incorporating soft start/stop into a multiple input/output power supply system using an active ORing circuit according to a third embodiment of the present invention.

FIG. 6B is a block diagram of an electrical system incorporating soft start/stop into a multiple input/output power supply system using an active ORing circuit according to a third embodiment of the present invention. FIG. 6B is an improvement on the typical/conventional circuit shown in FIG. 6A, obtained by incorporating soft start/stop into a multiple input/output power supply system using an active ORing circuit. The multiple power supply connecting system 311 shown in the dashed lines is the design improvement over the typical/conventional circuit shown in FIG. 6A.

In case of multi-channel input, along each channel a diode is connected in series with a resistor to isolate the inputs, as shown in FIG. 6B. The electrical system 105 in FIG. 6B includes an integrated active ORing circuit with soft-start/ stop features for multi-channel inputs. The first channel uses an ORing system 90_1, a delay module 338_1, a diode D_1, and resistor R_1 in series with the diode D_1, with both R_1 and D_1 in parallel with ORing system 90_1. The second channel uses an ORing system 90_2, a delay module 338_2, a diode D_2, and resistor R_2 in series with the diode D_2, with both R_2 and D_2 in parallel with ORing system 90_2. The third channel uses an ORing system 90_3, a delay module 338_3, a diode D_3, and resistor R_3 in series with the diode D_3, with both R_3 and D_3 in parallel with ORing system 90_3.

Although three power supply voltage inputs are shown in FIG. 6B, more than three or less than three power supply voltage inputs can be connected through multiple power supply connecting system 311, with each power supply voltage input connecting to its own ORing system with a diode and a resistor, inside multiple power supply connecting system 311.

Figure 7:
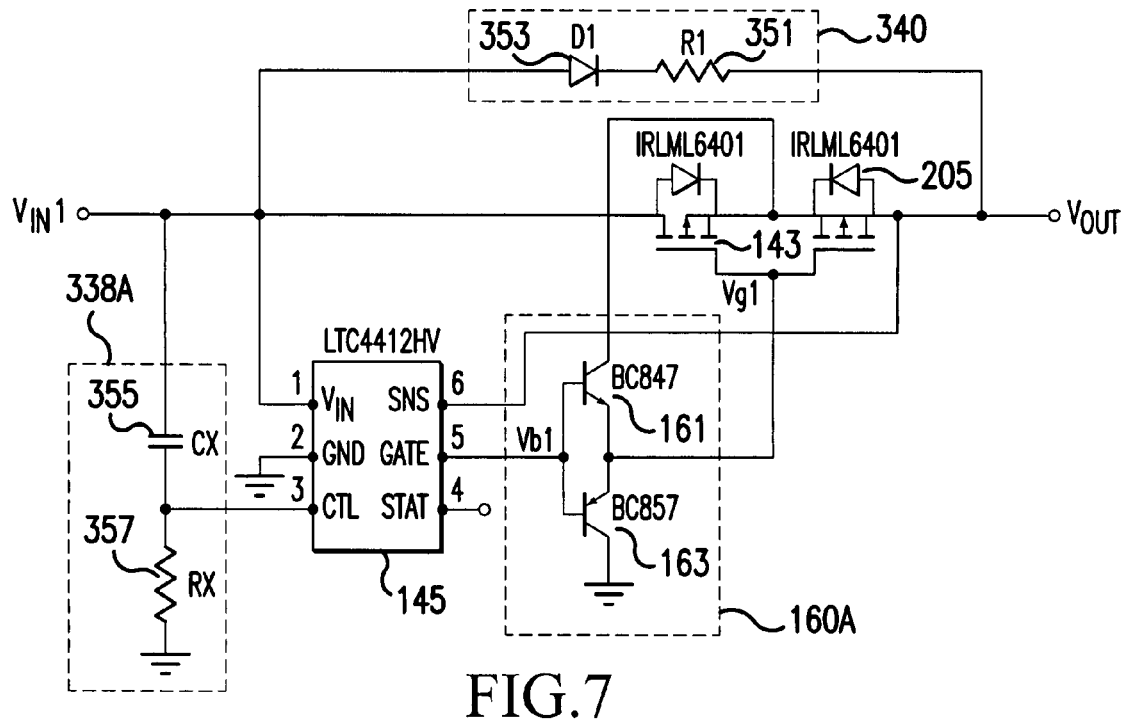
FIG. 7 illustrates an exemplary implementation for a block diagram of an electrical system incorporating soft start/stop into a multiple input/output power supply system using an active ORing circuit according to a third embodiment of the present invention illustrated in FIG. 6B.

FIG. 7 illustrates an exemplary implementation for a block diagram of an electrical system incorporating soft start/stop into a multiple input/output power supply system using an active ORing circuit according to a third embodiment of the present invention illustrated in FIG. 6B. FIG. 7 shows an exemplary circuit that implements the block diagram of FIG. 6B. The three dashed boxes in FIG. 7 are a driver 160A, a delay module 338A, and soft start/stop block 340 including a diode and a resistor. The driver 160A, the delay module 338A, and the soft start/stop block 340 represent improvements over typical/conventional circuits.

As shown in FIG. 7, the soft-start capability can be combined into the active oring circuit of FIG. 5A. The combined active ORing and soft-start circuit in FIG. 7 illustrates one input channel for a source. A plurality of input channels such as the one illustrated in FIG. 7 can be connected in parallel to create a multi-channel input. The input channel in FIG. 7 has a controller (element 145), a switch including a P-channel MOSFET (element 143) and a second P-channel MOSFET (element 205), a driver 160A, a soft start/stop block 340, and a delay module 338A.

The driver 160A includes a totem-pole driver composed of a pair of NPN and PNP transistors (totem-pole with 161 and 163). The delay module 338A includes a capacitor Cx (element 355) and a resistor Rx (element 357) connected at the source side. The soft start/stop block 340 includes a resistor R1 (element 351) and a diode D1 (element 353) connected between source and load for soft-start capability. The value of Rx and Cx can be chosen such that the controller (element 145) is enabled after the output capacitor is charged.

The controller (element 145) may be a LTC4412HV controller in ThinSOT from Linear Technology. Other controllers may also be used. Any ORing controller can be used for element 145. The P-channel MOSFETs (elements 143 and 205) may be IRLML6401 P-channel HEXFET® Power MOSFETs. Other P-channel MOSFETs may also be used; in fact any P-channel MOSFETs can be used. The NPN transistor (element 161) may be a BC847 transistor. Other NPN transistors may also be used. The PNP transistor (elements 163) may be a BC857 transistor. Other PNP transistors may also be used.

The MOSFETs 143 and 205 in FIG. 7 operate in switch mode, which leads to a higher efficiency, lower power dissipation, and optimized MOSFET selection. The hot swap is achieved by the parallel diode and resistor path through soft start/stop block 340, together with the delay circuit 338A for the gate signal. At initial power up, the delay module 338A holds the MOSFETs off. The output voltage is charged up through the parallel diode and resistor path of soft start/stop block 340. After a pre-defined delay, the MOSFETs are turned to bypass the diode and resistor D1 and R1. The delay and the parallel resistor R1 can be adjusted according to different applications. Hence, the design in FIG. 7 does not rely on MOSFET properties, and provides flexibility.

Figure 8:
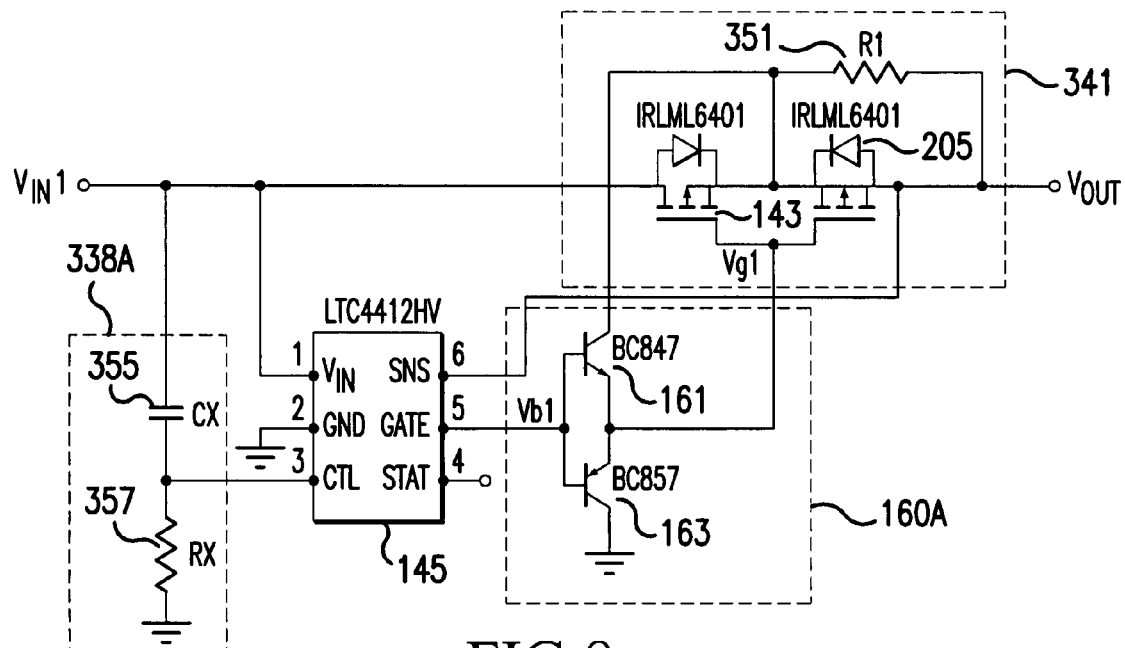
FIG. 8 illustrates another exemplary implementation for a block diagram of an electrical system incorporating soft start/stop into a multiple input/output power supply system using an active ORing circuit according to a third embodiment of the present invention illustrated in FIG. 6B.

FIG. 8 illustrates another exemplary implementation for a block diagram of an electrical system incorporating soft start/stop into a multiple input/output power supply system using an active ORing circuit according to a third embodiment of the present invention illustrated in FIG. 6B. FIG. 8 shows further design improvement to the circuit of FIG. 7. The circuit in FIG. 8 is more efficient, as it eliminates the discrete diode D1 from the circuit in FIG. 7, and uses the body diode of one of the MOSFETs (MOSFET 143) instead, to achieve soft-start. The three dashed boxes in FIG. 8 are a driver 160A, a delay module 338A, and a soft start/stop switch block 341.

The circuit in FIG. 8 illustrates one input channel for a source. A plurality of input channels such as the one illustrated in FIG. 8 can be connected in parallel to create a multi-channel input. The input channel in FIG. 8 has a controller (element 145), a soft start/stop switch block 341 including a P-channel MOSFET (element 143), a second P-channel MOSFET (element 205), and a resistor R1 (element 351), the driver 160A, and the delay module 338A.

The driver 160A includes a totem-pole driver composed of a pair of NPN and PNP transistors (totem-pole with 161 and 163). The delay module 338A includes a capacitor Cx (element 355) and a resistor Rx (element 357) connected at the source side. The value of Rx and Cx may be chosen such that the controller (element 145) is enabled after the output capacitor is charged.

The controller (element 145) may be a LTC4412HV controller in ThinSOT from Linear Technology. Other controllers may also be used. Any ORing controller can be used for element 145. The P-channel MOSFETs (elements 143 and 205) may be IRLML6401 P-channel HEXFET® Power MOSFETs. Other P-channel MOSFETs may also be used; in fact any P-channel MOSFETs can be used. The NPN transistor (element 161) may be a BC847 transistor. Other NPN transistors may also be used. The PNP transistor (elements 163) may be a BC857 transistor. Other PNP transistors may also be used.

The MOSFETs 143 and 205 in FIG. 8 operate in switch mode, which leads to a higher efficiency, lower power dissipation, and optimized MOSFET selection. The hot swap is achieved by the parallel diode and resistor path through soft start/stop switch block 341, together with the delay circuit 338A for the gate signal. At initial power up, the delay module 338A holds the MOSFETs off. The output voltage is charged up through the parallel diode and resistor path of soft start/stop switch block 341. After a pre-defined delay, the MOSFETs are turned to bypass the resistor R1. The delay and the parallel resistor R1 can be adjusted according to different applications. Hence, the design in FIG. 8 does not rely on MOSFET properties, and provides flexibility.

Figure 9A:
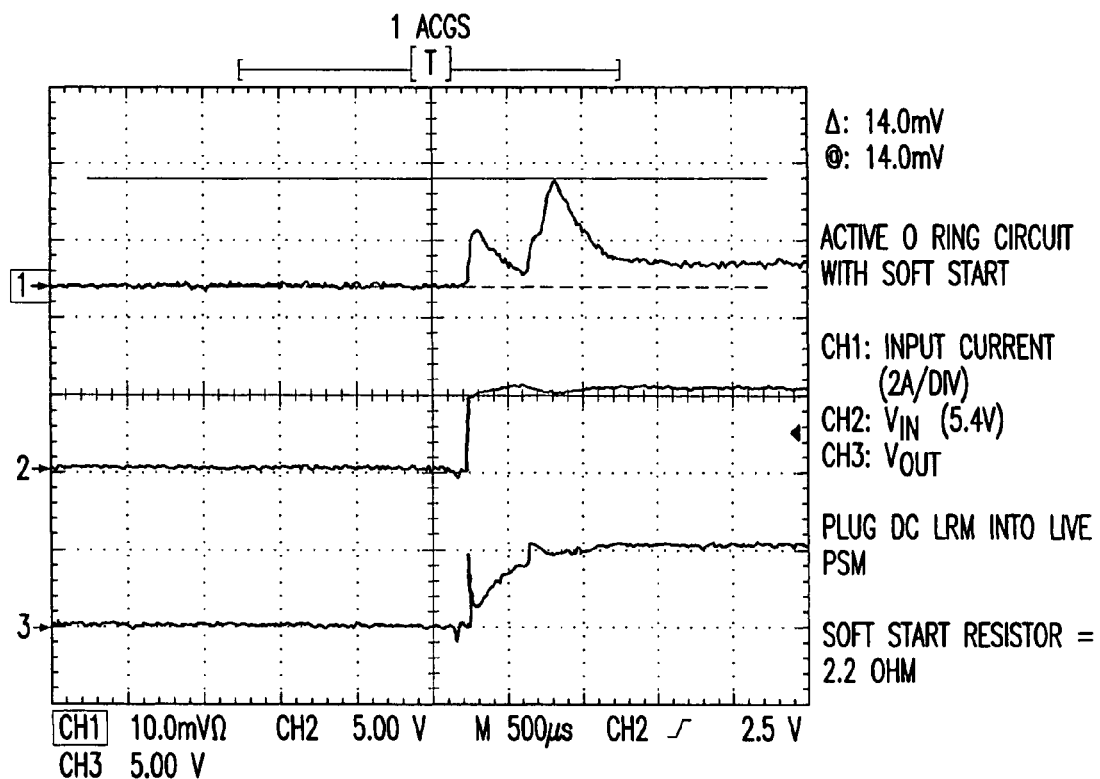
FIG. 9A is a graph of electrical parameters obtained when an LRM including the combined active ORing and soft-start circuit illustrated in FIG. 8 is plugged into a live PSM output.

FIG. 9A is a graph of electrical parameters obtained when an LRM including the combined active ORing and soft-start circuit illustrated in FIG. 8 is plugged into a live PSM output. The modified LRM is obtained by replacing schottky diodes in DC LRM as illustrated in FIG. 3A, with the combined active ORing and soft-start circuit illustrated in FIG. 8. Ch1 in FIG. 9A shows the input current waveform (2 A/div). The peak inrush current is about 2.8 A. Ch3 shows the output voltage, which rises gradually with overshoot. Ch2 is the input voltage.

Figure 9B:
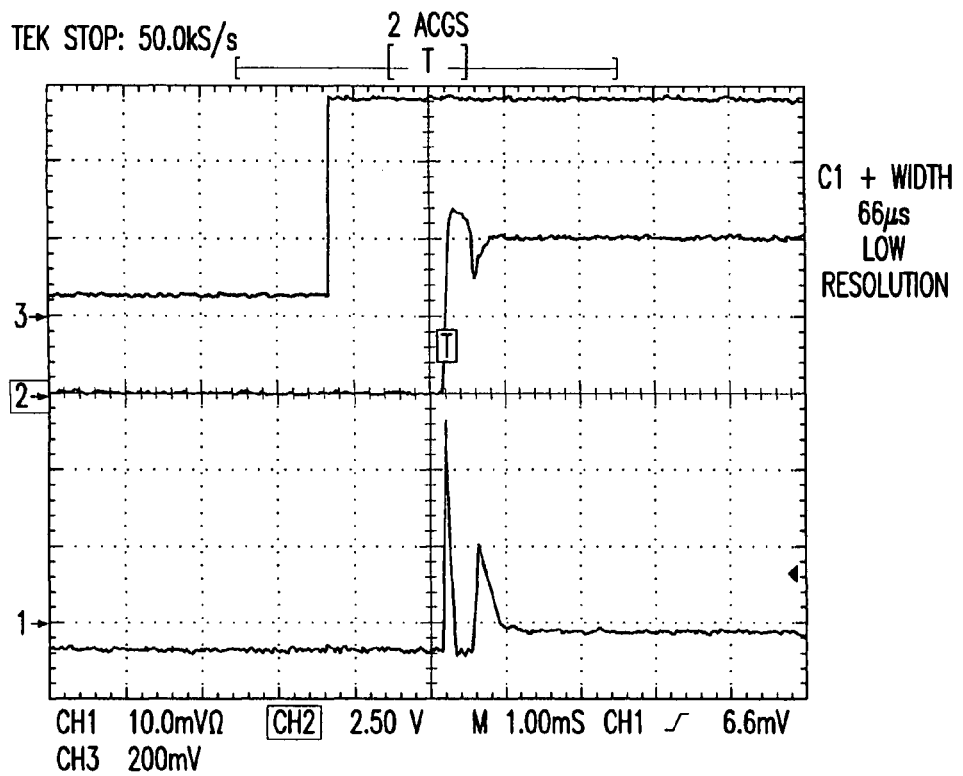
FIG. 9B is a graph of electrical parameters obtained when an LRM without an active ORing and soft-start circuit is plugged into a live PSM output.

For comparison, FIG. 9B is a graph of electrical parameters obtained when an original LRM that does not include an active ORing and soft-start circuit (as illustrated in FIG. 3A) is plugged into a live PSM output. In FIG. 9B, Ch1 shows the input current waveform. The peak inrush current in this case is about 6A (2 A/div). Ch2 shows the output voltage, which overshoots and undershoots around the final value. Ch3 is the input voltage, which is 28V, for a Line replaceable Module that includes the circuit in FIG. 3A, Ch3 voltage is measured using a 50:1 differential probe.

Figure 9C:
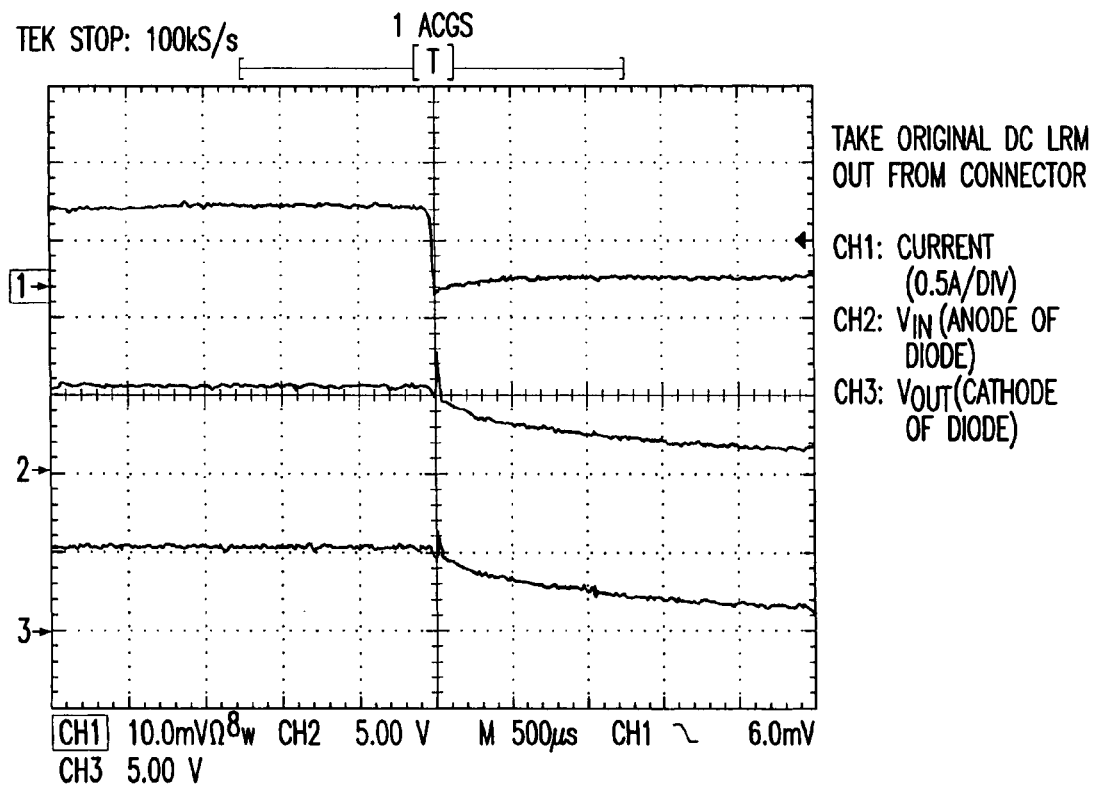
FIG. 9C is a graph of electrical parameters obtained when an LRM without an active ORing and soft-start circuit is unplugged from a live PSM.

FIG. 9C is a graph of electrical parameters obtained when an original LRM without an active ORing and soft-start circuit (as in FIG. 3A) is unplugged from a live PSM. In FIG. 9C, Ch1 shows the input current. Ch2 shows the input voltage. Ch3 shows the output voltage. Sharp voltage spikes can be seen on Ch2 and Ch3.

Figure 9D:
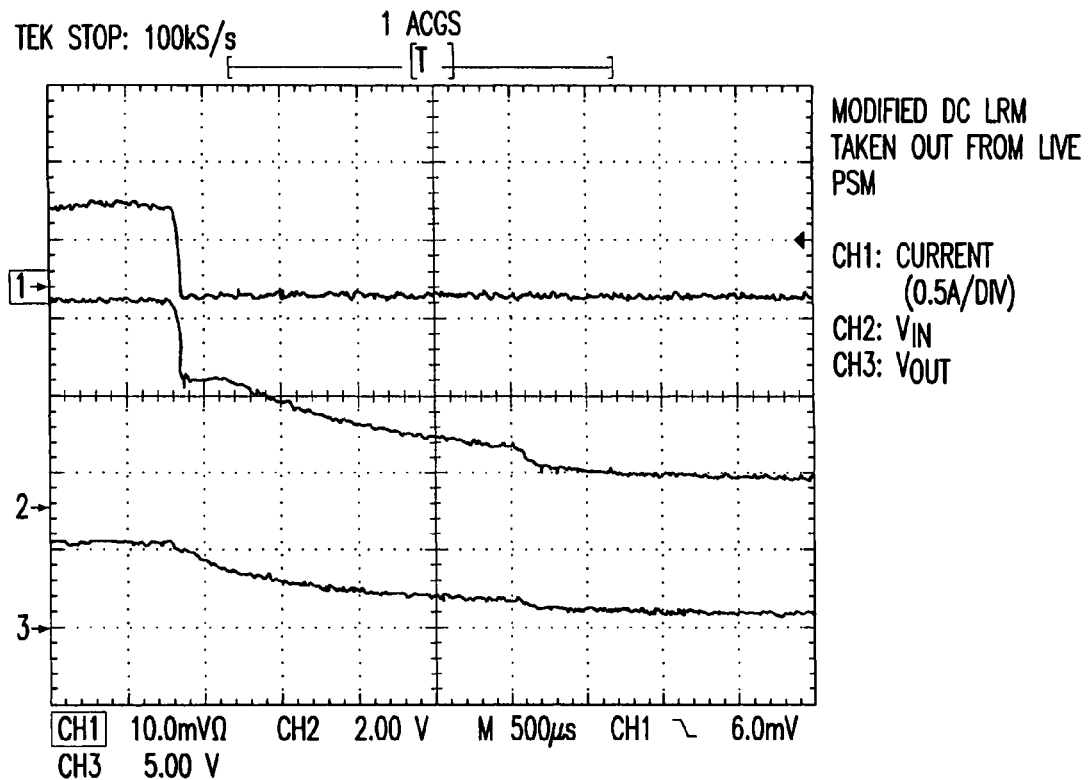
FIG. 9D is a graph of electrical parameters obtained when an LRM including the combined active ORing and soft-start circuit illustrated in FIG. 8 is unplugged from a live PSM output.

For comparison, FIG. 9D is a graph of electrical parameters obtained when a modified LRM including the combined active ORing and soft-start circuit illustrated in FIG. 8 is unplugged from a live PSM output. In FIG. 9D, Ch1 shows the input current. Ch2 shows the input voltage. Ch3 shows the output voltage. The sharp spikes that appeared in FIG. 9C are removed in the configuration of FIG. 9D, which shows that a successful soft stop has been achieved in FIG. 9D with the circuit from FIG. 8.

The graphs in FIGS. 9A, 9B, 9C and 9D were obtain for values for resistances, capacitance and the other electronic elements chosen according to configurations associated with AC and DC LRM configurations receiving the output Vout.

Although the active diode ORing systems presented in FIGS. 1, 2, and all figures from 4A to 9D were discussed in the context of LRMs, the active diode ORing systems presented in FIGS. 1, 2, and all figures from 4A to 9D are equally applicable to multi-channel input connection for other types of modules, circuits, and systems.

The active diode ORing systems presented in FIGS. 1, 2, and all figures from 4A to 9D properly connect multiple power supply voltage inputs to realize a fault tolerant power supply bus for LRMs; provide usage of an active ORing controller to achieve both active ORing and hot swap functions; avoid excessive power losses and voltage drops; control in-rush OR current chopping, and transient voltages/currents, during LRM hot swap insertion/extraction from a host system; avoid excessive voltage/current transients which stress/damage individual components and reduce MTBF; realize integrated active-diode-OR circuits that also provide soft power-up/down capability; provide a single power bus from multiple power supply input with minimum voltage drop and improved efficiency (no looses in the passive diodes); provide integrated soft-switching that reduces turn-on in-rush current during board insertion and further eliminates current-chopping during interruption of current in inductive circuits; provide methods to add/incorporate design improvement into active diode-OR circuits to achieve a better performance and at the same time provide a cost-effective soft-start and soft-stop method for hot-swap Line Replaceable Module applications; etc. The active diode ORing systems presented in FIGS. 1, 2, and all figures from 4A to 9D can be used with a variety of modules, including Line Replaceable Modules for AC and DC electric power systems which include AC/DC SSPC LRMs, Power Supply Modules, Digital Controller Boards/LRMs, etc.

The active diode ORing systems presented in FIGS. 1, 2, and all figures from 4A to 9D can be included in the hot swap systems presented in the co-pending non-provisional application titled "Method and Apparatus for Hot Swap of Line Replaceable Modules for AC and DC Electric Power Systems", the entire contents of which are hereby incorporated by reference. The active diode ORing systems presented in FIGS. 1, 2, and all figures from 4A to 9D effectively reduce turn-on in-rush current transients (during board/module insertion) and eliminate current-chopping which would otherwise require complete shut-down of the larger electrical system before any hot swap of a board/module can be achieved. The active diode ORing systems presented in FIGS. 1, 2, and all figures from 4A to 9D, are particularly useful in hot swap of high voltage modules.

The active diode ORing systems presented in FIGS. 1, 2, and all figures from 4A to 9D, can be implemented for hot swap at the level of basic hot swap, at the level of full hot swap, and at the level of highly available hot swap. The integration of the active diode ORing systems presented in FIGS. 1, 2, and all figures from 4A to 9D with the hot swap systems presented in the co-pending non-provisional application titled "Method and Apparatus for Hot Swap of Line Replaceable Modules for AC and DC Electric Power Systems", for the three levels of hot swap, is described in the "Method and Apparatus for Hot Swap of Line Replaceable Modules for AC and DC Electric Power Systems" application, the entire contents of which are hereby incorporated by reference.

Although some aspects of the present invention have been described in the context of aerospace applications, it should be realized that the principles of the present invention are applicable to other environments.

We claim:

1. An apparatus for power supply input connection, said apparatus comprising:

first and second switch modules connected to respective first second power supply inputs;

first and second controller modules connected to respective said first and second power supply inputs and to a secondary power connection;

first and second driver modules connected to respective said first and second controller modules and to respective said first and second switch module;

wherein the first and second controller modules and the first and second driver modules put said first switch module in a first operating state when a parameter relating to said first or second power supply input is larger than a parameter relating to said secondary power connection;

wherein the first and second controller module and the first or second driver module put said first switch module in a second operating state when said parameter relating to said first or second power supply input is smaller than said parameter relating to said secondary power connection; and a change of operating state of the second switching module develops prior to a change of operating state of the first switching module upon removal of the first power supply input and a change of operating state of the first switching module develops prior to a change of operating state of the second switching module upon removal of the second power supply input, whereby backfeeding associated with either of such removals is precluded.

2. The apparatus according to claim 1, wherein said first switch module is a P-channel field effect transistor whose gate is connected to said first driver module and said first driver module modifies a gate drive capability of said first switch module.

3. The apparatus according to claim 1, wherein said first switch module includes two P-channel field effect transistors connected back-to-back, wherein the gates of said two P-channel field effect transistors are connected to said first driver module, and said first driver module modifies gate drive capabilities of said two P-channel field effect transistors.

4. The apparatus according to claim 3, wherein said first driver module includes an npn transistor and a pnp transistor, arranged in a totem pole configuration.

5. The apparatus according to claim 3, wherein
said first operating state and said second operating state of said first switch module are on and off states, and said first operating state is different from said second operating state,
said parameter relating to said first power supply input is a voltage of said first power supply input, and
said parameter relating to said secondary power connection is a voltage of said secondary power connection.

6. The apparatus according to claim 1, wherein said first controller module is a LTC4412HV controller.

7. The apparatus according to claim 1, wherein at least one of the switch modules comprises:
two field-effect transistors (FET's) arranged back-to-back;
at least one of the gate driver modules connected to gates of both of the FET's; and
the at least one switch module is precluded from entering its linear region of control.

8. The apparatus according to claim 1, wherein said apparatus provides a single power bus from said first power supply input and said second power supply input, reduces voltage drop on said power bus, said power bus is fault tolerant and provides soft-switching, soft power-up, and soft power-down capability, during an insertion or extraction from a host system of a replaceable module receiving power from said power bus.

9. The apparatus according to claim 1, wherein said first controller module is an LTC4412HV controller, and said second controller module is an LTC4412HV controller.

10. The apparatus according to claim 1, wherein said apparatus provides a single power bus from said first power supply input and said second power supply input, reduces voltage drop on said power bus, wherein said power supply bus is fault tolerant and sends power to a replaceable module.

11. An apparatus for power supply input connection, said apparatus comprising:
a first switch module connected to a first power supply input, said first switch module including a first field effect transistor;
a first controller module connected to said first power supply input and to a secondary power connection, wherein said first controller module
puts said first switch module in a first operating state when a parameter relating to said first power supply input is larger than a parameter relating to said secondary power system, and
puts said first switch module in a second operating state when said parameter relating to said first power supply input is smaller than said parameter relating to said secondary power system;
a first driver module connected to said first controller module and to said first switch module, wherein said first driver module modifies a parameter relating to a drive characteristic of said first switch module; and
soft-start capability is provided with a first resistor connected to a body diode of said first field effect transistor, wherein said first resistor and said body diode of said first field effect transistor are connected in series between said first power supply input and said secondary power connection.

12. The apparatus according to claim 11, wherein said first field effect transistor is a P-channel field effect transistor whose gate is connected to said first driver module, wherein said first driver module modifies a gate drive capability of said first field effect transistor.

13. The apparatus according to claim 12, wherein said first switch module includes a second field effect transistor which is a P-channel field effect transistor, said first field effect transistor and said second field effect transistor are connected back-to-back, the gates of said first field effect transistor and said second field effect transistor are connected to said first driver module, and said first driver module modifies gate drive capabilities of said first field effect transistor and said second field effect transistor.

14. The apparatus according to claim 13, wherein said first driver module includes an npn transistor and a pnp transistor, arranged in a totem pole configuration.

15. The apparatus according to claim 14, wherein
said first operating state and said second operating state of said first switch module are on and off states, and said first operating state is different from said second operating state,
said parameter relating to said first power supply input is a voltage of said first power supply input, and
said parameter relating to said secondary power connection is a voltage of said secondary power connection.

16. The apparatus according to claim 11, wherein said first controller module is an LTC4412HV controller.

17. The apparatus according to claim 11, further comprising:
a second switch module connected to a second power supply input, said second switch module including a second field effect transistor, wherein said secondary power connection is an output of said second switch module;
a second controller module connected to said second power supply input and to an output of said first switch module, wherein said second controller module
puts said second switch module in a first operating state when a parameter relating to said second power supply input is larger than a parameter relating to said output of said first switch module, and
puts said second switch module in a second operating state when said parameter relating to said second power supply input is smaller than said parameter relating to said output of said first switch module;
a second driver module connected to said second controller module and to said second switch module, wherein said second driver module modifies a parameter relating to a drive characteristic of said second switch module; and
a second resistor connected to a body diode of said second field effect transistor, wherein said second resistor and said body diode of said second field effect transistor are connected in series between said second power supply input and said output of said first switch module.

18. The apparatus according to claim 17, wherein said apparatus provides a single power bus from said first power supply input and said second power supply input, reduces voltage drop on said power bus, said power bus is fault tolerant and provides soft-switching, soft power-up, and soft power-down capability, during an insertion or extraction from a host system of a replaceable module receiving power from said power bus.

19. A method for connection of power supply inputs, said method comprising:
providing a first power supply voltage input, a second power supply voltage input, and an output;
isolating said first power supply voltage input from said output with a first switch module, said first switch module including a first gate;

isolating said second power supply voltage input from said output with a second switch module, said second switch module including a second gate; and controlling said first switch module and said second switch module, said controlling step including changing an operating state of said first switch module when a voltage of said first power supply voltage input differs from a voltage of said second power supply voltage input, changing an operating state of said second switch module when a voltage of said second power supply voltage differs from a voltage of said first power supply voltage input, initiating the change of operating state of the second switching module prior to initiating the change of operating state of the first switching module in an event of removal of the first power supply input from the output, whereby backfeeding to the first power supply input is precluded; and initiating the change of operating state of the first switching module prior to initiating the change of operating state of the second switching module in an event of removal of the second power supply input from the output, whereby backfeeding to the second power supply input is precluded.

20. The method for connection of power supply inputs as recited in claim 19, said method providing a fault tolerant power bus from said first power supply input and said second power supply input, and reducing voltage drop on said power bus.

21. The method for connection of power supply inputs as recited in claim 19, said method providing soft-switching, soft power-up, and soft power-down capability during an insertion or extraction from a host system of a replaceable module receiving power from said power bus, by reducing turn-on in-rush current during insertion of said replaceable module, and eliminating current-chopping during interruption of current in inductive circuits of said host system and said replaceable module, wherein said method uses a first resistor, and a first diode in series with said first resistor, said first resistor and said first diode being connected in parallel to said first switch module, and a second resistor, and a second diode in series with said second resistor, said second resistor and said second diode being connected in parallel to said second switch module.

* * * * *